United States Patent [19]

Takagi et al.

[11] 4,197,814
[45] Apr. 15, 1980

[54] APPARATUS FOR FORMING COMPOUND SEMICONDUCTOR THIN-FILMS

[75] Inventors: Toshinori Takagi, Nagaokakyo; Kiyoshi Morimoto, Mobara, both of Japan

[73] Assignee: Futaba Denshi Kogyo K.K., Chiba, Japan

[21] Appl. No.: 870,096

[22] Filed: Jan. 17, 1978

[30] Foreign Application Priority Data

Feb. 12, 1977 [JP] Japan ................................ 52-14433

[51] Int. Cl.$^2$ ............................................. C23C 13/12
[52] U.S. Cl. .................................. 118/726; 427/255.2
[58] Field of Search ............... 118/49, 49.1, 49.5, 118/50.1, 723, 726; 427/248 A, 248 R, 248 B, 248 C, 248 J, 294

[56] References Cited

U.S. PATENT DOCUMENTS

| | | | |
|---|---|---|---|
| 2,752,882 | 7/1956 | Heimann | 118/49 |
| 2,845,894 | 8/1958 | McIlvaine | 118/49.1 |
| 2,938,816 | 5/1960 | Gunther | 118/49 X |
| 3,446,936 | 5/1969 | Hanson et al. | 118/49.1 X |
| 3,583,361 | 6/1971 | Laudel, Jr. | 118/49.5 |
| 3,926,508 | 12/1975 | Harmsen et al. | 427/248 C |
| 4,082,636 | 4/1978 | Takagi | 118/49.1 |
| 4,098,919 | 7/1978 | Morimoto et al. | 427/294 |

FOREIGN PATENT DOCUMENTS 2711714 9/1977 Fed. Rep. of Germany .......... 118/49.1

*Primary Examiner*—Mervin Stein
*Attorney, Agent, or Firm*—Oblon, Fisher, Spivak, McClelland & Maier

[57] ABSTRACT

An apparatus for forming compound semiconductors, which has a plurality of closed type crucibles for separately holding and vaporizing the component elements of a desired compound semiconductor thin-film, the crucibles each having at least one injection nozzle, a plurality of temperature control sections for separately controlling vapor pressures inside the crucibles so that the vapors jetted from the injection nozzles of the crucibles may form clusters, a plurality of ionization chambers provided in the vicinity of the injection nozzles of the crucibles respectively for ionizing the clusters, and acceleration power supplies provided between a substrate and the ionization chambers for giving kinetic energy to the cluster ions to make them impinge on the surface of the substrate so as to form a thin film thereon.

2 Claims, 2 Drawing Figures

APPARATUS FOR FORMING COMPOUND SEMICONDUCTOR THIN-FILMS

BACKGROUND OF THE INVENTION

1. Field of the Invention

The present invention relates to an apparatus for forming a compound-semiconductor thin-film, which can form high-quality compound semiconductors using the cluster ion beam deposition method.

2. Description of the Prior Art

In addition to element semiconductors consisting of such elements as silicon or germanium, compound semiconductors consisting of two or more kinds of elements such as those of Groups II and VI or Groups III and V have been proposed recently and brought into practical use as light-emission diodes, semiconductor lasers, etc.

In the case of the compound semiconductor, the band gap may be optionally changed by varying the kinds of the component elements and composition thereof. Therefore, for instance, the light-emission diode mentioned above can be made to emit light of any desired wavelength in the region from red light to green light. In addition, the compound semiconductor is very large in the mobility of electrons, and therefore is finding practical applications in ultra high frequency devices, solid-state oscillation elements for microwave, laser oscillation elements, etc.

The above-mentioned compound semiconductor has been heretofore produced by making it grow epitaxially on a substrate by the use of the vapor or liquid growth process, and the like. However, the above production method of the compound semiconductor has the following disadvantages.

First, the component elements of the compound semiconductor are different in chemical and thermodynamic properties from one another. Therefore very complicated operations and processes are necessary to produce a desired product having a correct stoichiometric composition. For instance, in the case of the III-V compound semiconductor, its components of Group V such as phosphorus (P) and arsenic (As) are very high in vapor pressure though it is a high melting point compound. Therefore, in order to produce a semiconductor high in crystal quality, it is necessary to process phosphorus, arsenic, and so on in a high-pressure atmosphere, since otherwise the substances high in vapor pressure tend to escape as the temperature increases.

In addition, if the crystal quality is poor, the semiconductor tends to cleave along crystal grain boundaries and therefore requires a troublesome post-treatment.

Moreover, the compound semiconductor is composed of a plurality of component elements different in property. Therefore, the conventional method requires very complicated processes for the production of the compound semiconductors as mentioned above and as a result can hardly mass-produce the products. Thus the compound semiconductors produced become high in price.

SUMMARY OF THE INVENTION

The present invention contemplates to eliminate the above-mentioned disadvantages of the prior art.

It is an object of the present invention to provide an apparatus for forming compound semiconductor thin-films, which can produce compound semiconductors high in crystal quality.

It is another object of the present invention to provide an apparatus for forming compound semiconductor thin-films, which can produce a compound semiconductor having a correct stoichiometric composition by simple processes.

It is still another object of the present invention to provide an apparatus for forming compound semiconductor thin-films, which can carry out very efficient production.

It is a further object of the present invention to provide an apparatus for forming compound semiconductor thin-films, which can produce compound semiconductors very inexpensively.

According to the present invention, there is provided an apparatus in which the component elements of a compound semiconductor are held and vaporized separately in a plurality of closed type crucibles each having at least one injection nozzle, the pressures of vapors produced in the individual crucibles are controlled according to the stoichiometric composition of the semiconductor to be produced, then the vapors are jetted through the injection nozzles into a high vacuum region to produce atomic groups called clusters, the clusters thus produced are ionized into cluster ions, the cluster ions are accelerated at high voltage separately according to the component elements and thereby are made to impinge on a substrate to form thereon a compound semiconductor film having a desired stoichiometric composition and high in crystal quality.

Other objects, features and advantages of the present invention will be hereinafter described with reference to the accompanying drawings.

DETAILED DESCRIPTION OF THE PREFERRED EMBODIMENTS

Figure 1:
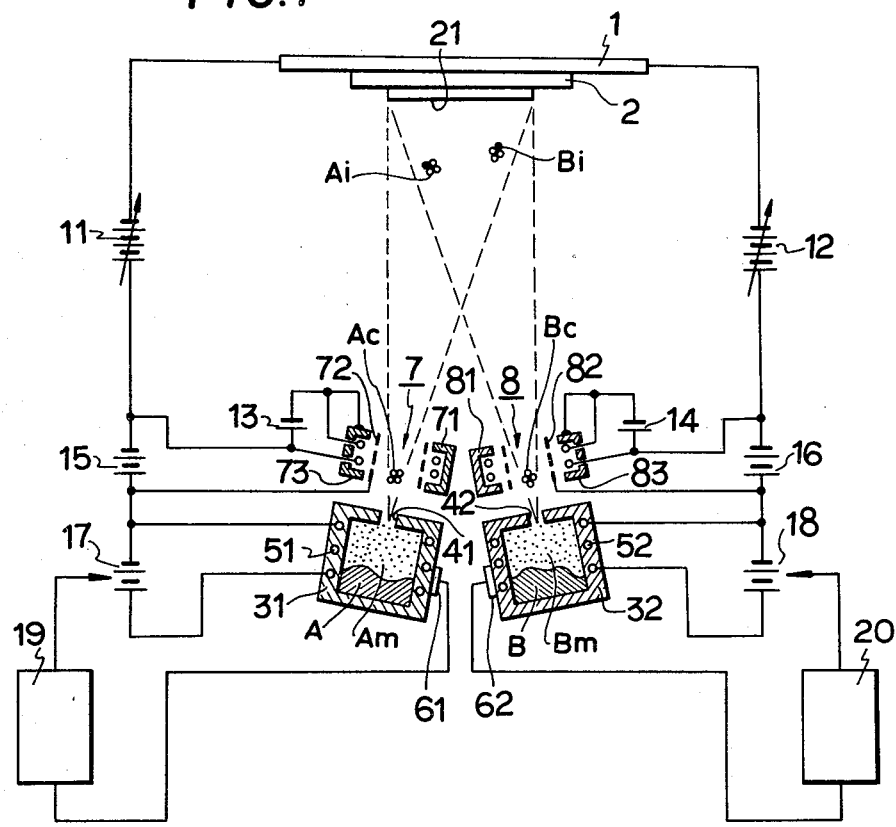
FIG. 1 shows the schematic arrangement of an apparatus for forming compound semiconductor thin-films according to one preferred embodiment of the present invention.

Description will be made on a preferred embodiment of the present invention shown in FIG. 1. The main parts of the apparatus of the present invention shown in FIG. 1 are disposed in a high vacuum atmosphere having a pressure of $10^{-2}$ Torr or less, preferably $10^{-4}$ Torr or less.

Reference numeral 1 designates a substrate holder for supporting a substrate 2 on which a desired compound semiconductor thin-film is to be formed, and is made of conducting material. Reference numerals 31 and 32 designate closed type crucibles respectively. Each crucible 31 or 32 has at least one small-diameter injection nozzle 41 or 42. The crucibles 31 and 32 are filled with substances-to-be-vaporized A and B containing the respective component elements of a desired compound semiconductor respectively. In addition, the crucibles 31 and 32 have, for instance, heating elements 51 and 52 inside the walls thereof respectively so that they may be heated by the so-called resistance heating method. Moreover, these crucibles 31 and 32 are provided, at the surfaces of the walls thereof, with thermocouples 61 and 62 respectively so that the temperatures thereof may be measured.

Reference numerals 7 and 8 designate ionization chambers provided in the vicinity of the injection nozzles 41 and 42 of the crucibles 31 and 32 respectively. The ionization chambers 7 and 8 are provided respectively with filaments 71 and 81 for emitting thermions, acceleration electrodes 72 and 82 for accelerating the thermions emitted from the filaments 71 and 81 respectively, and shielding boards 73 and 83 for preventing undesirable scattering of the above-mentioned thermions.

Reference numerals 11 and 12 designate acceleration power supplies for keeping the substrate holder 1 at highly negative potential with respect to the ionization chambers 7 and 8 by the externally variable outputs thereof so as to give kinetic energies to positively ionized particles for their movement toward the substrate 2 respectively.

Reference numerals 13 and 14 designate power supplies for heating the filaments 71 and 81 thereby making them emit thermions respectively.

Reference numerals 15 and 16 designate ionization power supplies respectively. The power supplies 15 and 16 are used for keeping the acceleration electrodes 72 and 82 at highly positive potential with respect to the filaments 71 and 81 thereby to accelerate thermions emitted from the filaments 71 and 81 and to ionize particles in the ionization chambers 7 and 8 respectively.

Reference numerals 17 and 18 designate power supplies for energizing the heating elements 51 and 52 of the crucibles 31 and 32 respectively. The power supplies 17 and 18 are so made that the outputs thereof can be also externally varied at will.

Reference numerals 19 and 20 are temperature control sections respectively. The temperature control sections 19 and 20 are used for controlling the temperatures of the crucibles 31 and 32 in response to the outputs of the thermocouples 61 and 62 provided on the crucibles 31 and 32 respectively. More particularly, the temperatures of the crucibles 31 and 32 detected by the thermocouples 61 and 62 respectively are compared with the set temperatures inside the temperature control sections 19 and 20 respectively, according to the detected deviations, the outputs of the power supplies 17 and 18 are controlled thereby to control the temperatures of the crucibles 31 and 32 respectively. Thus, the vapor pressures in the crucibles 31 and 32 are kept at set values respectively.

All the above-mentioned parts except the power supplies 11 to 18 and the temperature control sections 19 and 20 are contained in a vacuum container not shown. The vacuum container is evacuated by an exhausting system (not shown) to keep the parts therein under a high vacuum atmosphere having a pressure of $10^{-2}$ Torr or less, preferably $10^{-4}$ Torr or less.

With the above-mentioned construction, the apparatus of the present invention may be operated as follows:

First, the crucibles 31 and 32 are filled with substances-to-be-vaporized A and B containing the component elements of a desired compound semiconductor, respectively. In this case, the crucibles 31 and 32 may be supplied with the component elements in the form of elements or compounds respectively. When the compound elements are supplied in compounds, however, the compounds must be selected so that the gases of the elements thereof other than the above-mentioned component elements have no adverse effect on others.

The following examples may be enumerated as the foregoing substances-to-be-vaporized A and B. When the III–V compound semiconductor is to be formed, the crucible 31 may be supplied with gallium (Ga) or indium (In), while the crucible 32 with arsenic (As) or phosphorus (P).

Then the heating elements 51 and 52 of the crucibles 31 and 32 containing the substances A and B respectively are energized by the power supplies 17 and 18 respectively to heat the crucibles 31 and 32 thereby forming vapors Am and Bm of the substances A and B respectively.

Simultaneously, the temperature control sections 19 and 20 control the outputs of the power supplies 17 and 18 to regulate the temperatures of the crucibles 31 and 32 respectively so that the pressures of the vapors Am and Bm in the crucibles 31 and 32 may exceed at least 100 times the pressures outside the crucibles 31 and 32 respectively.

For instance, if the crucibles 31 and 32 are disposed in a vacuum region having a pressure of $10^{-4}$ Torr or less, the temperatures of the crucibles 31 and 32 are set so that the pressures therein may exceed at least $10^{-2}$ Torr.

In addition, while maintaining the above-mentioned pressure difference between the outside and inside of the crucibles 31 and 32, the temperatures of the crucibles 31 and 32 are separately controlled so that the pressures of the vapors Am and Bm may correspond to the stoichiometric composition of a compound semiconductor to be formed.

Then the vapors Am and Bm in the crucibles 31 and 32 are jetted into a vacuum region having a pressure of 1/100 or less of the pressures inside the crucibles 31 and 32 through the injection nozzles 41 and 42 respectively. In this case, the crucibles 31 and 32 are separately controlled by the temperature control sections 19 and 20 respectively so that the set temperatures thereof may be maintained. Therefore, the thermal equilibrium in the crucibles 31 and 32 can be maintained even when the vapors Am and Bm are jetted therefrom.

The vapors Am and Bm thus jetted from the crucibles 31 and 32 respectively are subjected to the supercooling phenomenon caused by the adiabatic expansion thereof when jetted. As a result, they are formed into atomic groups each normally consisting of about 100 to 2,000 atoms loosely bonded together by van der Waals attractive forces or, in other words, into clusters Ac and Bc respectively.

By the action of the kinetic energy which the vapors Am and Bm have when jetted, the clusters Ac and Bc enter the ionization chambers 7 and 8 respectively, where they are formed into cluster ions Ai and Bi if at least one of the atoms of the cluster is ionized by electron beams emitted from the filament 71 or 81.

The acceleration power supplies 11 and 12 give kinetic energy to the cluster ions Ai and Bi respectively to move and accelerate them toward the substrate 2. Thus, the cluster ions Ai and Bi together with the neutral clusters Ac and Bc not ionized in the ionization chambers 7 and 8 and moving toward the substrate 2 by the action of the kinetic energy they have when jetted, impinge on the substrate 2 to form thereon a compound semiconductor thin-film 21 high in crystal quality.

In this case, the kinetic energies of the cluster ions Ai and Bi and clusters Ac and Bc that have impinged on the substrate 2 are converted into spattering energy for the surface of the substrate 2, heat energy, ion implantation energy, etc. In addition, the clusters have a peculiar surface migration effect. Thus, a thin-film 21 having high in crystal quality and bonding strength with respect to the substrate 2 and between the atoms thereof can be obtained.

The cluster ions Ai and Bi are separately accelerated by the acceleration power supplies 11 and 12 respectively.

The kinetic energies given to the cluster ions Ai and Bi are separately and optionally controlled by properly setting the output values of the acceleration power supplies 11 and 12 respectively.

Thus, the bonding conditions of the cluster ions Ai and Bi with respect to the substrate 2 and those between the atoms on the substrate 2 can be controlled at will. In addition, the pressures of the vapors in the crucibles 31 and 32 are well controlled as mentioned above. Because of these two facts, the composition of the compound semiconductor thin-film 21 formed can be made close to the stoichiometric composition thereof.

As mentioned above, the cluster ion is a cluster in which one of the atoms thereof is ionized. As a result, the e/m value is very small. Accordingly, the potential of the substrate 2 can be minimized even when the substrate 2 is made of insulating material, and therefore the thin-film crystal can be formed very efficiently.

It will be understood from the foregoing description that the apparatus for producing compound semiconductor thin-films according to the present invention has the following features and advantages:

The components elements of a desired compound semi-conductor are separately placed in a plurality of closed type crucibles each having at least one injection nozzle respectively. The component elements are separately heated to be converted into vapors which are then jetted from the injection nozzles to form clusters. The clusters are ionized to become cluster ions and kinetic energies are given to the cluster ions separately. Therefore, the apparatus of the present invention has an excellent advantage in that it can form a compound semiconductor thin-film consisting of elements different in physical and thermodynamic properties and, in addition, high in crystal quality.

Moreover, the apparatus of the present invention can form a high-quality thin-film by separately controlling the vapor pressures inside the crucibles and the acceleration energies of cluster ions.

The foregoing features enable the apparatus of the present invention to produce a compound semiconductor thin-film high in crystal quality and consisting of such a combination of elements as cannot be formed into a high-quality thin-film by the conventional apparatus. Thus, the apparatus of the present invention becomes possible to produce novel devices or elements in the fields of microwaves, optoelectronics, etc.

Furthermore, the apparatus of the present invention forms the thin-film using cluster ions and neutral clusters. Accordingly, the spattering energy, heat energy, surface migration effect occurring when the cluster ions and clusters impinge on the substrate make it possible to form a compound semiconductor thin-film high in crystal quality on a given substrate.

In addition, the apparatus of the present invention can form a compound semiconductor thin-film without complicated processes, and therefore can make the product very inexpensive and offers various favorable effects on production.

Generally speaking, when a single crystal layer is to be made to epitaxially grow on a substrate, it is important to keep the substrate at the so-called epitaxial temperature or higher.

In this connection, the preferred embodiment of the present invention shown in FIG. 1 can keep the substrate 2 at a certain temperature or higher, because when the cluster ions Ai and Bi or clusters Ac and Bc impinge on the substrate 2, their kinetic energy is converted into heat energy thereby heating the substrate 2.

Figure 2:
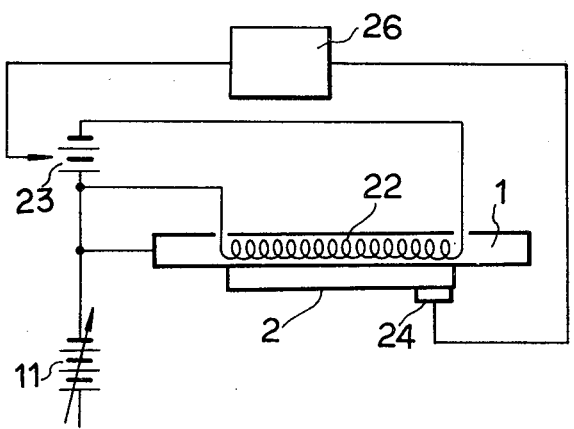
FIG. 2 shows the schematic arrangement of the essential part of an apparatus for forming compound semiconductor thin-films according to another preferred embodiment of the present invention.

If the above-mentioned heat energy alone cannot realize the satisfactory epitaxial temperature, a heating device may be provided at the substrate holder 1 as shown in FIG. 2 so as to keep the substrate 2 at the epitaxial temperature or higher.

Now another preferred embodiment of the present invention will be hereinafter described with reference to FIG. 2.

As shown in FIG. 2, a heating element 22 is provided inside the substrate holder 1 and is so arranged that it can be heated by a power supply 23.

If the correct control of the temperature of the substrate 2 is required, a thermocouple 24 is mounted on the substrate 2 to measure the substrate temperature. The measured value of the substrate temperature is put in a temperature control section 26, which controls the output value of the power supply 23 according to the deviation of the measured value from the set value thereby to keep the temperature of the substrate 2 at the set value.

Thus, the apparatus according to the preferred embodiment of the present invention shown in FIG. 2 can make the effective epitaxial growth of a compound semiconductor thin-film on the substrate 2.

In the above preferred embodiments of the present invention, two crucibles are provided so as to produce a two-element compound semiconductor thin-film. However, the number of crucibles may be determined according to the number of component elements of the compound semiconductor thin-film to be produced, for instance, three crucibles for the three-element compound semiconductor thin-film.

If at the same time, the compound semiconductor is to be "doped" with impurities for the determination of the conduction type thereof, any one of the crucibles is filled with a doping substance. The doping may be carried out by processing the above doping substance to form clusters and cluster ions simultaneously with other component elements or after the thin-film has been formed on the substrate.

In the above-mentioned preferred embodiments of the present invention, the crucibles are heated by the resistance heating method. However, this method may be replaced by other heating methods such as the electron impact method.

In addition, the thermocouple for measuring the crucible temperature may be replaced by the optical pyrometer.

Obviously, many modifications and variations of the present invention are possible in the light of the above teachings. It is therefore to be understood that within the scope of the appended claims the invention may be practiced otherwise than as specifically described herein.

What is claimed as new and desired to be secured by Letters Patent of the United States is:

1. An apparatus for forming a thin-film of a compound semiconductor consisting of at least two elements on a substrate, which comprises a common vacuum container maintained at a first pressure level, a plurality of closed type crucibles for separately holding substances-to-be vaporized containing the component elements of said compound semiconductor and vaporizing said substances by heating to produce vapors thereof, said crucibles being provided in said vacuum container and each having at least one injection nozzle disposed opposite to said substrate, a plurality of temperature control sections for separately controlling the pressure of said vapors in said crucibles and maintaining said pressures at a second level higher than said first pressure level so that the vapors jetted from the injection nozzles of said crucibles respectively are subjected to supercooling as a result of adiabatic expansion through said nozzles to form clusters, said temperature control sections being provided in said vacuum container, a plurality of ionization chambers for ionizing said clusters, said ionization chambers being provided in said vacuum container and in the vicinity of the injection nozzles of said crucibles respectively, a plurality of acceleration power supplies provided between said substrate and respective ionization chambers for separately giving kinetic energy to the ionized clusters or cluster ions separately formed in said ionization chambers to make said cluster ions impinge on the surface of said substrate.

2. The apparatus as set forth in claim 1, wherein said ionization chambers are provided separately in the vicinity of the injection nozzles of said crucibles, respectively.

* * * * *